(12) United States Patent
Oh et al.

(10) Patent No.: US 9,905,436 B2
(45) Date of Patent: Feb. 27, 2018

(54) WAFER LEVEL FAN-OUT PACKAGE AND METHOD FOR MANUFACTURING THE SAME

(71) Applicant: STS Semiconductor & Telecommunications Co., Ltd., Cheonan-si, Chungcheongnam-do (KR)

(72) Inventors: You Jin Oh, Cheonan-si (KR); Eun Dong Kim, Seoul (KR); Jong Won Lee, Seoul (KR); Jai Kyoung Choi, Busan (KR)

(73) Assignee: STS SEMICONDUCTOR & TELECOMMUNICATIONS CO., LTD. (KR)

( * ) Notice: Subject to any disclaimer, the term of this patent is extended or adjusted under 35 U.S.C. 154(b) by 0 days.

(21) Appl. No.: 15/054,097

(22) Filed: Feb. 25, 2016

(65) Prior Publication Data

US 2017/0092510 A1    Mar. 30, 2017

(30) Foreign Application Priority Data

Sep. 24, 2015  (KR) .................. 10-2015-0135146
Sep. 24, 2015  (KR) .................. 10-2015-0135147
Sep. 24, 2015  (KR) .................. 10-2015-0135148
Sep. 24, 2015  (KR) .................. 10-2015-0135149

(51) Int. Cl.
*H01L 21/00* (2006.01)
*H01L 21/48* (2006.01)
*H01L 21/56* (2006.01)

(52) U.S. Cl.
CPC ...... *H01L 21/4825* (2013.01); *H01L 21/4828* (2013.01); *H01L 21/4842* (2013.01); *H01L 21/4882* (2013.01); *H01L 21/56* (2013.01)

(58) Field of Classification Search
None
See application file for complete search history.

(56) References Cited

U.S. PATENT DOCUMENTS

| 2003/0017647 | A1  | 1/2003  | Kwon et al. |
| 2005/0242422 | A1  | 11/2005 | Klein et al. |
| 2009/0236686 | A1* | 9/2009  | Shim, II ............... H01L 21/568 257/528 |
| 2012/0119346 | A1* | 5/2012  | Im .......................... H01L 21/563 257/690 |
| 2013/0299973 | A1  | 11/2013 | Choi et al. |

FOREIGN PATENT DOCUMENTS

| JP | 2012109572  A | 6/2012 |
| JP | 2013098373  A | 5/2013 |
| KR | 100666919   B1 | 1/2007 |
| KR | 20080102641 A | 11/2008 |
| KR | 20090114675 A | 11/2009 |
| KR | 20140123695 A | 10/2014 |

* cited by examiner

*Primary Examiner* — Cory Eskridge
(74) *Attorney, Agent, or Firm* — Renaissance IP Law Group LLP

(57) ABSTRACT

A method for manufacturing a wafer level fan-out package includes attaching a semiconductor chip on a partial area of an IO pattern formed on one surface of a wafer, forming a first passivation layer on surfaces of the semiconductor chip and the wafer, forming an RDL (redistribution layer) that is electrically conducted with the IO pattern and the semiconductor chip, in a partial area of a top surface of the first passivation layer, and forming a second passivation layer on the top surface of the first passivation layer and a partial surface of the RDL.

3 Claims, 13 Drawing Sheets

WAFER LEVEL FAN-OUT PACKAGE AND METHOD FOR MANUFACTURING THE SAME

CROSS-REFERENCE TO RELATED APPLICATION

This application claims priority to and the benefit of Korean Patent Application No. 10-2015-0135146, filed on Sep. 24, 2015, Korean Patent Application No. 10-2015-0135147, filed on Sep. 24, 2015, Korean Patent Application No. 10-2015-0135148, filed on Sep. 24, 2015 and Korean Patent Application No. 10-2015-0135149, filed on Sep. 24, 2015, the disclosure of which is incorporated herein by reference in its entirety.

BACKGROUND

1. Field of the Invention

The present invention relates to a fan-out package of a wafer level and a method for manufacturing the same.

2. Discussion of Related Art

In recent years, according to the rapid development of the electronic industries, various techniques have been developed in the fields of electronic devices and circuit boards. In particular, electronic products tend to be lighter and smaller and to have multifunction and high performance, so that integrated circuit packaging technologies have been required according to these tendencies.

The integrated circuit packaging refers to things which form signal input/output terminals toward a main board using a lead frame or a PCB (printed circuit board) and are molded using an encapsulant, in order to optimize and maximize the electrical performance of a semiconductor chip.

Such integrated circuit packaging protects a semiconductor chip such as a single device, an integrated circuit, or the like which is formed in such a manner that a variety of electronic circuits and wiring are laminated, from various external environments, for example, dust, moisture, electrical and mechanical load, and the like.

Meanwhile, in the past, chips in a wafer form are separated one by one and then subjected to a packaging step to be used, and traditionally, a packaging method such as QFP (quad flat package), CSP (chip scale package), BGA (ball grid array), or the like has been used.

In a case in which the packaging is performed by separating the chips in this manner, each chip should be treated individually. Accordingly, when performing a patterning operation or the like, a problem in the alignment of the chips may occur, and the sizes of the chips tend to be gradually smaller, and thereby it is difficult to treat the individual chips.

In order to overcome these problems, a WLP (wafer level packaging) is used. The WLP is a technique in which packaging proceeds on the whole chips without separating the chips from the wafer or the individual chips are rearranged in a wafer form and then packaging proceeds, packaging is completed through the above-described method, and then the chips are subjected to a dicing step for cutting the completed packaging one by one in units of the individual chips and used. Through this, the packaging step may be simplified and the chip size obtained after performing the packaging may be also miniaturized, and thereby an area in which the chips are mounted on the PCB is also reduced so that a semiconductor assembly process is dramatically improved.

Through such WLP, the size of the package may be reduced, and a CSP (chip scale package) having a substantially similar size to the latest chip size has been developed.

However, in recent years, as the mobile markets such as smart phones, tablet PCs, portable game devices, and the like are expanded, the chip size is required to be further smaller. In contrast, the number of input/output (I/O) terminals of the chips tends to increase rather than decrease. Accordingly, there is a limitation in meeting this requirement when using a fan-in package such as the existing CSP or the like.

In the conventional CSP, the arrangement of solder balls for input and output is not larger than the chip size, so this was referred to as the fan-in package. However, the latest chip size is gradually miniaturized, whereas the number of I/O terminals of the chips remains as is or rather increases for the purpose of performance improvement. Accordingly, there arises a case in which the fan-in package is not able to afford the increasing number of I/O terminals, that is, the number of solder balls.

In order to address this problem, a WLP in which an area where the solder balls are arranged is larger than the chip size has been developed, and this is referred to as a fan-out WLP.

FIGS. 1A to 1E are views showing a process of manufacturing a WLP according to the related art.

First, referring to FIG. 1A, bottom surfaces of individual chips 10 separated from a wafer state are attached on a top surface of a carrier wafer 12 (or mold frame) at predetermined intervals using a double-sided adhesive tape 11.

Next, as shown in FIG. 1B, the individual chips 10 are all molded with a molding compound resin 20 at the same time, and the molding compound resin 20 having a predetermined thickness encapsulates top surfaces and side surfaces of the individual chips 10.

Next, as shown in FIG. 1C, when the molding compound resin 20 containing the individual chips 10 is removed from an adhesive surface of the carrier wafer 12, the bottom surfaces of the individual chips are exposed to the outside. Next, a grinding step proceeds so that upper and bottom surfaces of the molding compound resin 20 becomes even surfaces, and a cleaning step for the bottom surfaces of the chips proceeds.

Next, as shown in FIG. 1D, a process for forming an RDL (redistribution layer) 30 which is a kind of metal wiring line and bumps 40 proceeds from bonding pads of the individual chips 10 to a desired position of the bottom surface of the molding compound resin 20.

The RDL refers to a metal wiring line that extends outward from the bonding pad so that I/O terminals are attached with wider intervals. In a case in which the I/O terminals such as solder balls are attached on the bonding pads of the individual chips which form a fine pitch therebetween, the RDL may solve electric short phenomena which occur because the I/O terminals are brought into contact with each other.

In this instance, typically, a passivation layer is formed on the surface except the bonding pads of the chips, and the RDL is formed on the formed passivation layer by a plating step. Next, an insulating passivation layer for preventing short phenomena between the RDLs while blocking moisture, various foreign substances, and the like from penetrating into the RDL is formed on the formed RDL, and description of the specific formation process will be omitted.

Finally, as shown in FIG. 1E, a process in which sawing is performed along a sawing line (each package boundary line of the molding compound resin) proceeds. Thus, individual wafer level fan-out packages including the individual chips 10, the molding compound resin 20 formed in the peripheries of the chips, the lower RDL 30, the bumps 40, and the like are completed.

However, in a case of a process for manufacturing a wafer level package according to the related art, individual dies on the sawn wafer are attached on the carrier, and then an encapsulation step proceeds. In this instance, steps from the encapsulation step to a step before a bumping step proceeds are considerably long, so that a process lead time is long, resulting in a reduction in the yield and an increase in the costs.

In addition, the related art has a single package structure so there is a limit to apply various applications thereto. The molding compound resin may act as the wafer, and therefore warpage of the fan-out package occurs frequently upon the bumping step, and cracks are generated when the warpage is severe.

In addition, the wafer level package according to the related art has the single package structure, so it is difficult to configure packages in various forms.

Meanwhile, in such a semiconductor package, a heat dissipating means for dissipating, to the outside, heat generated from the inside of the package upon operation of the package is generally employed. That is, the characteristics of a semiconductor device in the form of die are sensitively changed according to moisture, temperature, and the like.

Thus, when the semiconductor device generates a lot of heat while being operated, a means for effectively radiating heat generated from the inside in a process in which semiconductor dies are processed and assembled into the semiconductor package is employed.

However, in the related art, in a case of a semiconductor package to which a heat spreader is attached, the heat spreader is attached for each unit, and thus there is a problem that the processing time becomes longer.

In this regard, in Korean Patent Application No. 10-0666919 (Title: Adhesive sheet for semiconductor package, semiconductor device having the same, multi-stack package having the same, and method for manufacturing the semiconductor device and method for manufacturing the multi-stack package), an adhesive sheet for a semiconductor package which includes an adhesive layer that is adhered to a bottom surface of a semiconductor chip; a deformation suppression layer that is embedded in the adhesive layer to suppress deformation of the semiconductor chip; and a base film that is formed on a bottom surface of the adhesive layer is disclosed.

In addition, in Korean Patent Laid-Open Publication No. 10-2008-0102641 (Title: Semiconductor package having heat spreader), a semiconductor package which includes a semiconductor chip in which a pad is formed; a metal pattern for a RDL that connects the pad to a solder ball; a heat spreader to which the semiconductor chip is attached; and an insulating layer that is laminated on the heat spreader to seal the semiconductor chip and in which the metal pattern for the RDL is disposed and the solder ball is formed is disclosed. Here, for a fan-out structure, an area of the heat spreader and an area in which the solder ball is disposed are larger than an area of the semiconductor chip, and the heat spreader is made of a metallic material.

SUMMARY OF THE INVENTION

The present invention is directed to a wafer level fan-out package which may omit a molding step from a packaging process and easily achieve a fan-out package structure while suppressing occurrence of cracks and warpage, and a method for manufacturing the same.

The technical objectives of the inventive concept are not limited to the above disclosure; other objectives may become apparent to those of ordinary skill in the art based on the following descriptions.

According to a first aspect of the present invention, there is provided a method for manufacturing a wafer level fan-out package including: attaching a semiconductor chip on a partial area of an IO pattern formed on one surface of a wafer; forming a first passivation layer on surfaces of the semiconductor chip and the wafer; forming an RDL (redistribution layer) that is electrically conducted with the IO pattern and the semiconductor chip, in a partial area of a top surface of the first passivation layer; and forming a second passivation layer on the top surface of the first passivation layer and a partial surface of the RDL.

According to a second aspect of the present invention, there is provided a method for manufacturing a wafer level fan-out package including: attaching a first semiconductor chip on a partial area of an IO pattern formed on one surface of a wafer; forming a first passivation layer on surfaces of the first semiconductor chip and the wafer; forming a first RDL that is electrically conducted with the IO pattern and the first semiconductor chip, in a partial area of a top surface of the first passivation layer; attaching a second semiconductor chip on a top surface of the first semiconductor chip; forming a second passivation layer on a top surface of the second semiconductor chip and the top surface of the first passivation layer; forming a second RDL that is electrically conducted with the first RDL and the second semiconductor chip, in a partial area of a top surface of the second passivation layer; and forming a third passivation layer on the top surface of the second passivation layer and a surface of the second RDL.

According to a third aspect of the present invention, there is provided a method for manufacturing a wafer level fan-out package including: attaching a first semiconductor chip on a partial area of an IO pattern formed on one surface of a wafer; forming a first passivation layer on surfaces of the first semiconductor chip and the wafer; forming a first RDL that is electrically conducted with the IO pattern and the first semiconductor chip, in a partial area of a top surface of the first passivation layer; forming a second passivation layer on the top surface of the first passivation layer and a partial surface of the first RDL; attaching a second semiconductor chip on a top surface of the second passivation layer so as to correspond to the first semiconductor chip; forming a third passivation layer on a top surface of the second semiconductor chip and the top surface of the second passivation layer; forming a second RDL that is electrically conducted with the first RDL and the second semiconductor chip, in a partial area of a top surface of the third passivation layer; and forming a fourth passivation layer on the top surface of the third passivation layer and a surface of the second RDL.

According to a fourth aspect of the present invention, there is provided a wafer level fan-out package which is manufactured according to the method for manufacturing the wafer level fan-out package according to the first to third aspects of the present invention.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1A:
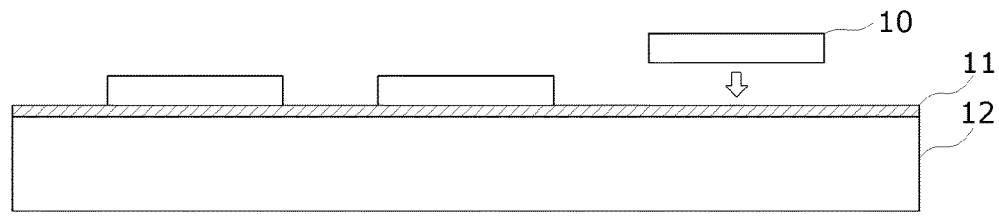
FIGS. 1A to 1E are cross-sectional views showing a process for manufacturing a wafer level package according to the related art.
Figure 1B:
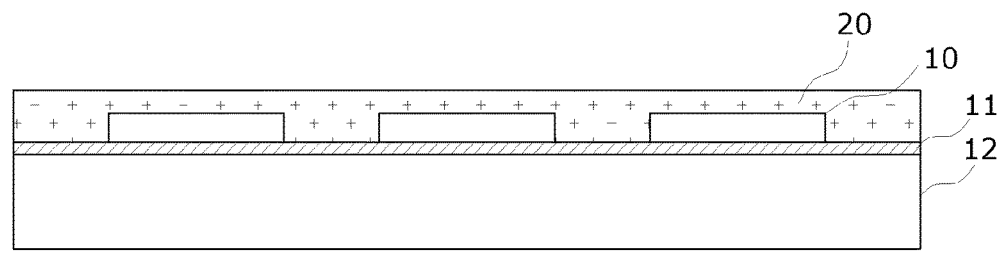
Figure 1C:
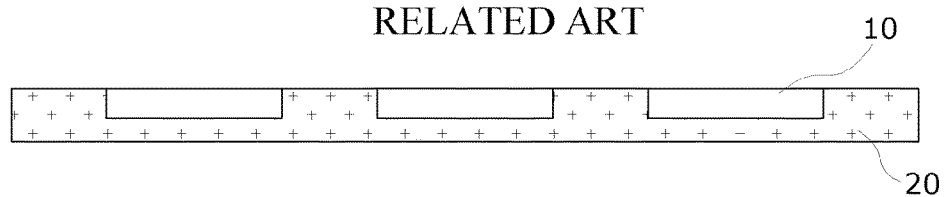
Figure 1D:
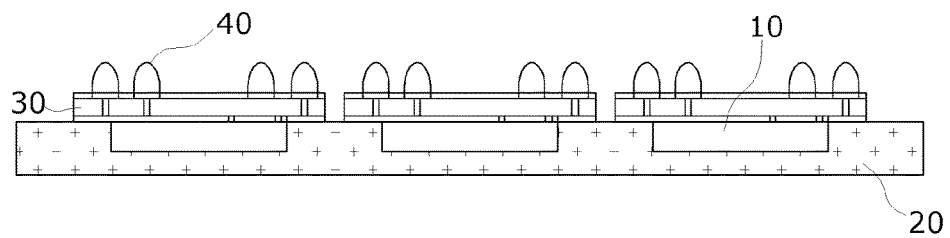
Figure 1E:
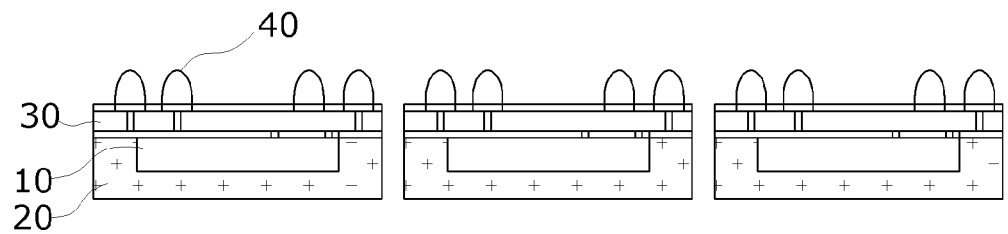

In the following description, embodiments of the present invention will be described in detail with reference to the accompanying drawings in such a manner that the invention may be easily carried out by a person having ordinary skill in the art to which the invention pertains. However, the present application may be implemented in many different forms and should not be construed as limited to the embodiments set forth herein. In the drawings, in order to clearly describe the present invention, parts which are not related to the description will be omitted. In the drawings, like reference numerals refer to the like elements throughout.

Throughout the specification, when a predetermined portion is described to be "connected to" another portion, it includes a case where the predetermined portion is electrically connected to the other portion by disposing still another predetermined element therebetween, as well as a case where the predetermined element is directly connected to the other element.

Throughout the specification, when a predetermined member is positioned "on" another member, it includes a case in which still another member exists between the two members as well as a case in which the predetermined member is in contact with the other member.

In the specifications, it should be understood that the terms "comprising," or "including" when used in these specifications, specify the presence of stated features, attributes, compositions, and components, but do not preclude the presence or addition of one or more other features, attributes, compositions, components, and a combination thereof. The terms of a degree such as "about", "substantially", etc. as used herein the specification are used, when manufacturing and material tolerances inherent in the mentioned meaning are provided, to mean the provided tolerances or an approximation thereof, and used to prevent an unscrupulous infringer from exploiting contents including an accurate or absolute numerical value for understanding of the present disclosure. Herein, the term "-(a) step" or the "step of" used throughout the present disclosure does not mean a "step for".

FIGS. 2A to 2H are cross-sectional views showing a process for manufacturing a wafer level fan-out package according to a first embodiment of the present invention.

Figure 2A:
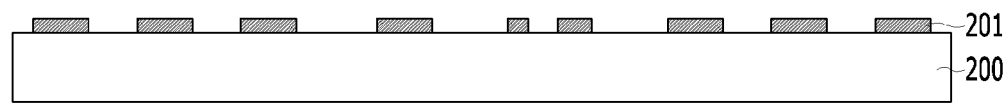
FIGS. 2A to 2H are cross-sectional views showing a process for manufacturing a wafer level fan-out package according to a first embodiment of the present invention.

First, as shown in FIG. 2A, an IO pattern 201 is formed on one surface of a wafer 200 by plating UBM (under bump metallurgy) and Copper (Cu). In this instance, a silicon (Si) bare wafer or a glass wafer may be used as the wafer 200, and thus a warpage phenomenon that occurs in the process may be minimized.

Figure 2B:
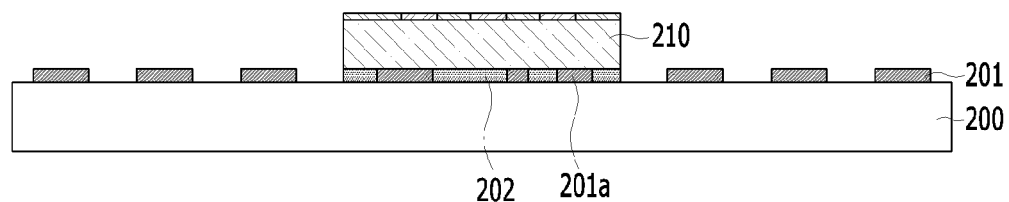

Next, as shown in FIG. 2B, a semiconductor chip 210 is attached on partial areas 201a of the IO pattern 201 formed on the one surface of the wafer 200. In order to secure such a semiconductor chip 210, a double-sided tape 202 referred to as a DAF (die attachment film) or epoxy 202 may be used.

Figure 2C:
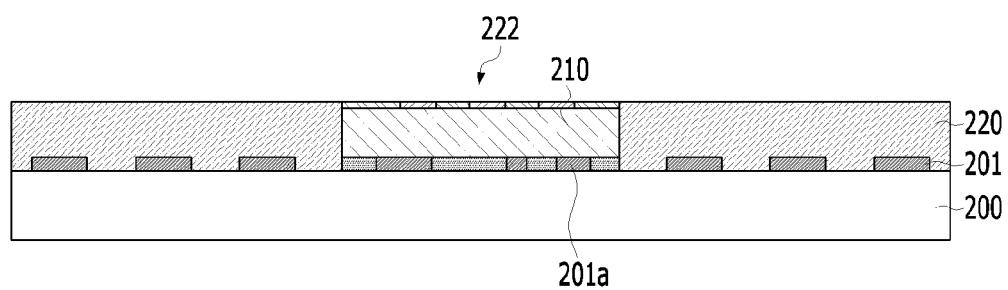

Next, as shown in FIG. 2C, a first passivation layer 220 is formed on the surfaces of the semiconductor chip 210 and the wafer 200. As the material of the first passivation layer 220, any one material selected from PI (polyimide), BCB (benzocyclobutene), PBO (polybenzoxazole), BT (bismaleimide triazine), a phenolic resin, epoxy, silicone, a silicon dioxide ($SiO_2$) film, a silicon nitride ($Si_3N_4$) film, and their equivalents may be used, and these materials may be used alone or in combination.

The first passivation layer 220 may be formed with a certain height so that a top surface of the semiconductor chip 210 is coated. An opening portion 222 that is patterned to expose the top surface of the semiconductor chip 210 may be formed in the first passivation layer 220. The opening portion 222 of the first passivation layer 220 may be formed using a general photolithographic process.

Figure 2D:
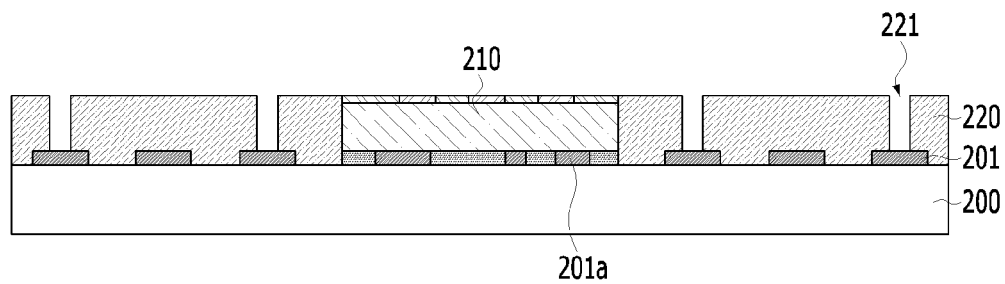
Figure 2E:
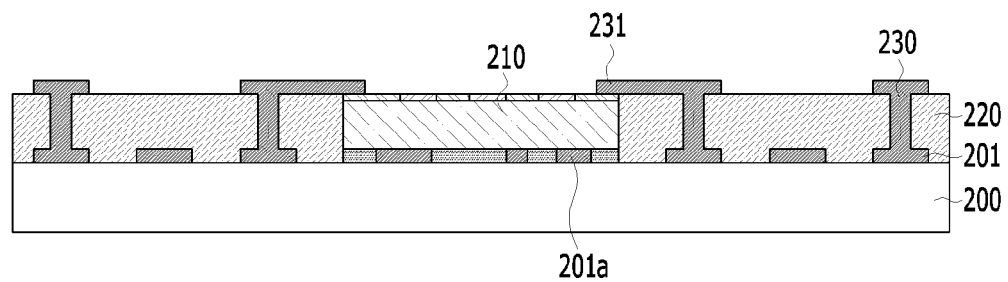

Next, as shown in FIGS. 2D and 2E, RDLs (redistribution layer) 230 and 231 which are electrically conducted with the IO pattern 201 and the semiconductor chip 210 are formed in partial areas of a top surface of the first passivation layer 220. For such RDLs 230 and 231, grooves 221 for the RDLs 230 and 231 are first formed on the top surface of the first passivation layer 220 so as to correspond to the partial areas of the IO pattern 201 by using a photolithographic process using a photomask.

Specifically, the grooves 221 are formed in such a manner that a photomask with a groove pattern for the RDLs 230 and 231 formed thereon is aligned on the top surface of the first passivation layer 220 and is irradiated with light, and thereby the first passivation layer 220 corresponding to the grooves 221 is removed. In this instance, areas in which the pattern is formed out of the entire photomask may be irradiated with light.

When the grooves 221 for the RDLs 230 and 231 are formed in this manner, the grooves 221 formed so as to be conducted with the semiconductor chip 210 and the IO pattern 201 may be plated with a metallic material for RDL. In this instance, the metallic material for RDL may be formed so as to correspond to a portion in which external connection terminals 250 are to be formed through an etching process.

Figure 2F:
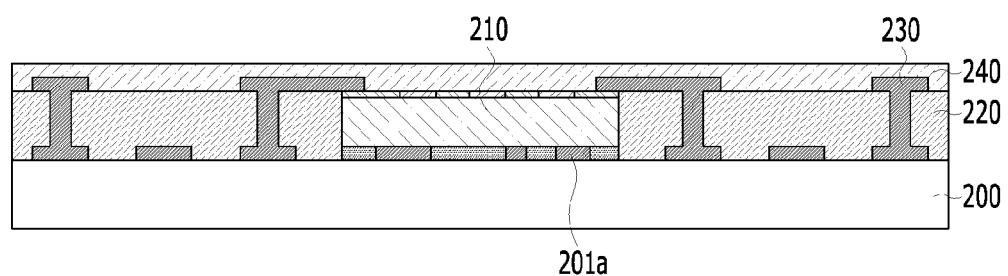
Figure 2G:
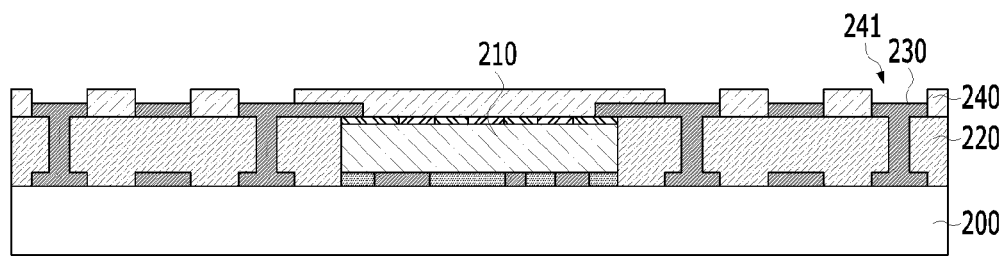

Next, as shown in FIGS. 2F to 2G, a second passivation layer 240 is formed on the top surface of the first passivation layer 220 and a partial surface of the RDL. The second passivation layer 240 may be made of the same material as that of the first passivation layer 220. In this instance, opening portions 241 which are patterned to expose a part of the RDL 230 are formed in the second passivation layer 240. The opening portions 241 of the second passivation layer 240 may be formed using a general photolithographic process.

Next, a UBM seed layer is formed between the patterns of the second passivation layer 240. The UBM seed layer covers the opening portions 241 of the second passivation layer 240.

Next, UBM is formed by filling metal between the patterns of the second passivation layer 240 in which the UBM seed layer is formed. The UBM is formed above the UBM seed layer, and electrically connected to the UBM seed layer. In this instance, the metallic material forming the UBM may be chromium/chromium-copper alloy/copper (Cr/Cr—Cu/Cu), titanium-tungsten alloy/copper (Ti—W/Cu) or aluminum/nickel/copper (Al/Ni/Cu), or their equivalents.

Figure 2H:
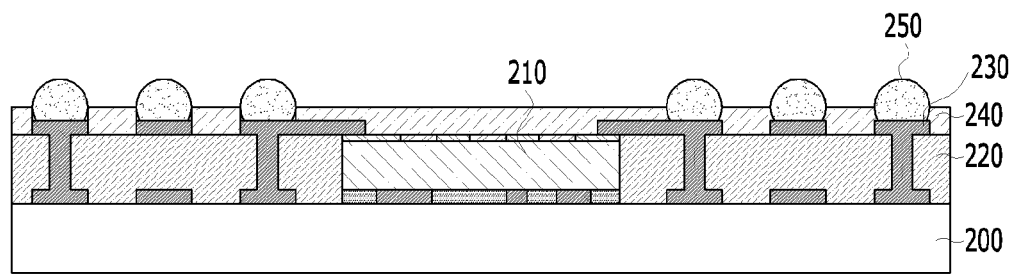

Meanwhile, a fan-out package which is manufactured by a method for manufacturing a wafer level fan-out package according to the first embodiment of the present invention may be carried out in the form in which an external connection terminal is not formed. Unlike this, as shown in FIG. 2H, the external connection terminals 250 may be formed in the opening portions 241 which are partial areas of the RDL in which the second passivation layer 240 is not formed.

In this instance, the external connection terminals 250 may be, for example, bumps, solder balls, bonding wire, or the like, and contain gold, silver, copper, tin, or nickel. In addition, the electrical connection between the RDL 230 and the external connection terminal 250 may be made better by performing general reflow and cleaning processes.

FIGS. 3A to 3F are views showing an example in which the wafer level fan-out package formed according to the first embodiment of the present invention is applied.

Figure 3A:
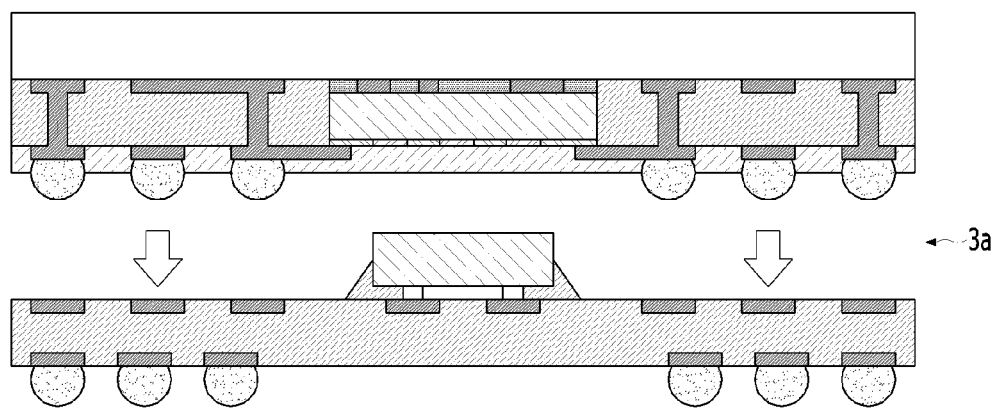
FIGS. 3A to 3F are views showing an example in which the wafer level fan-out package formed according to the first embodiment of the present invention is applied.
Figure 3B:
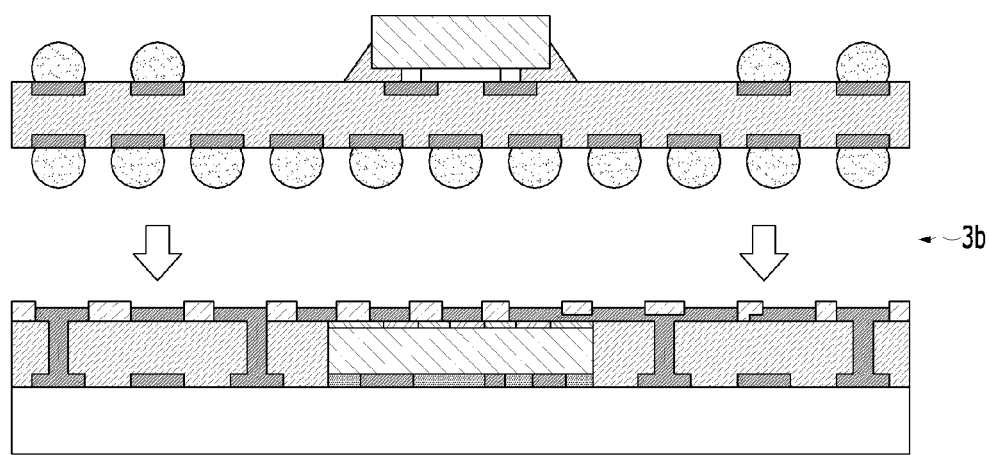
Figure 3C:
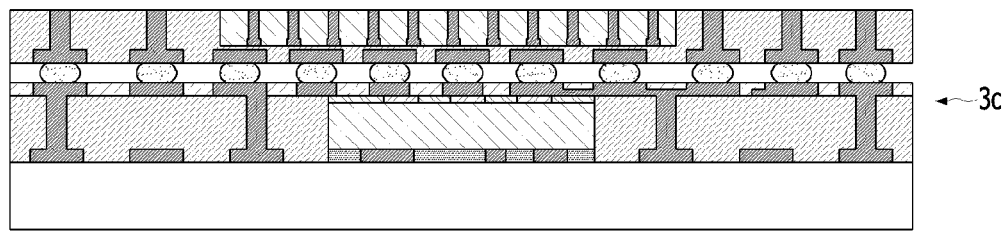
Figure 3D:
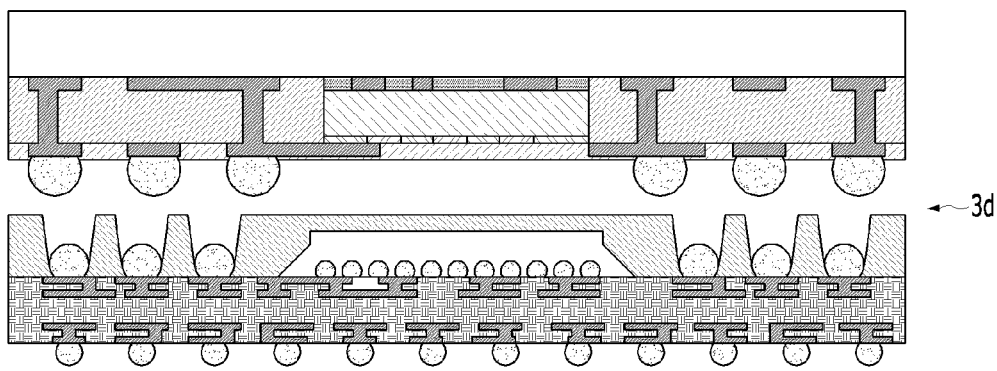
Figure 3E:
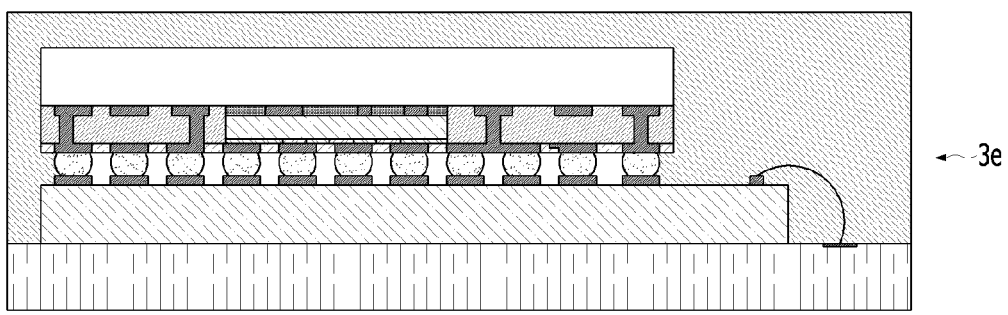
Figure 3F:
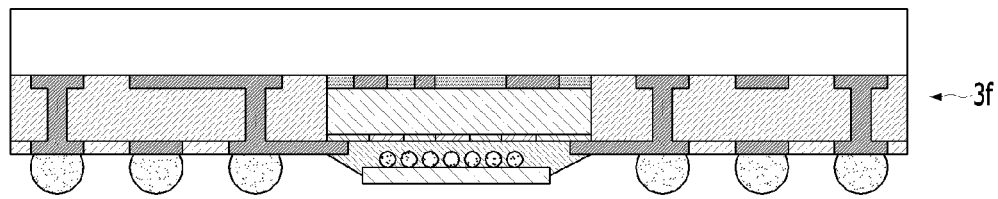

The wafer level fan-out package formed according to the first embodiment of the present invention can be applied in various forms such as a PoP (package on package) top package 3a of FIG. 3A, a PoP bottom package 3b of FIG. 3B, a form 3c in which the wafer level fan-out package is coupled to TSEV (TSV in TEV) of FIG. 3C, a form 3d in which the wafer level fan-out package is coupled to TMV (through mold via) of FIG. 3D, a PIP (package in package) form 3e of FIG. 3E, an COC (chip on chip) form 3f of FIG. 3F, and the like.

Next, a process for manufacturing a wafer level fan-out package according to a second embodiment of the present invention will be described with reference to FIGS. 4A to 4F.

Hereinafter, the semiconductor chip 210 in FIGS. 2A to 2E may be referred to as a first semiconductor chip 410, and the RDLs 230 and 231 in FIGS. 2A to 2E may be referred to as a first RDL 430.

Figure 4A:
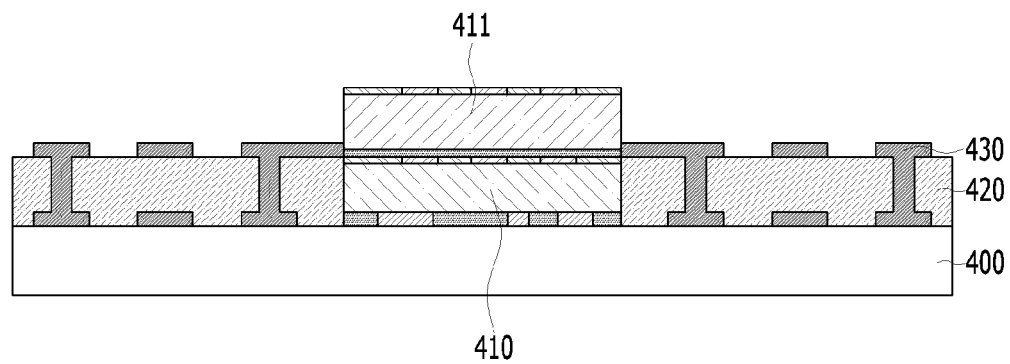
FIGS. 4A to 4F are cross-sectional views showing a process for manufacturing a wafer level fan-out package according to a second embodiment of the present invention.

As to the wafer level fan-out package according to the second embodiment of the present invention, a second semiconductor chip 411 is attached on a top surface of the first semiconductor chip 410 as shown in FIG. 4A, in a state in which the first RDL 430 is formed according to the process shown in FIGS. 2A to 2E. In this instance, the second semiconductor chip 411 may be attached through an attachment film such as a double-sided tape or epoxy in the same manner as that in the first semiconductor chip 410.

Figure 4B:
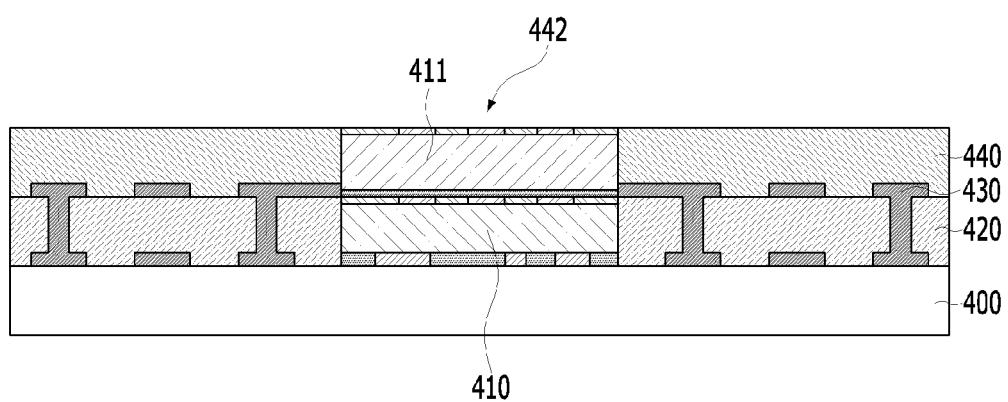

Next, as shown in FIG. 4B, a second passivation layer 440 is formed on top surfaces of the second semiconductor chip 411 and a first passivation layer 420. In this instance, the second passivation layer 440 may be made of the same material as that of the first passivation layer 420.

The second passivation layer 440 may be formed with a certain height so that the top surface of the second semiconductor chip 411 is coated. An opening portion 442 that is patterned to expose the top surface of the second semiconductor chip 411 may be formed in the second passivation layer 440. The opening portion 442 may be formed using a general photolithographic process.

Figure 4C:
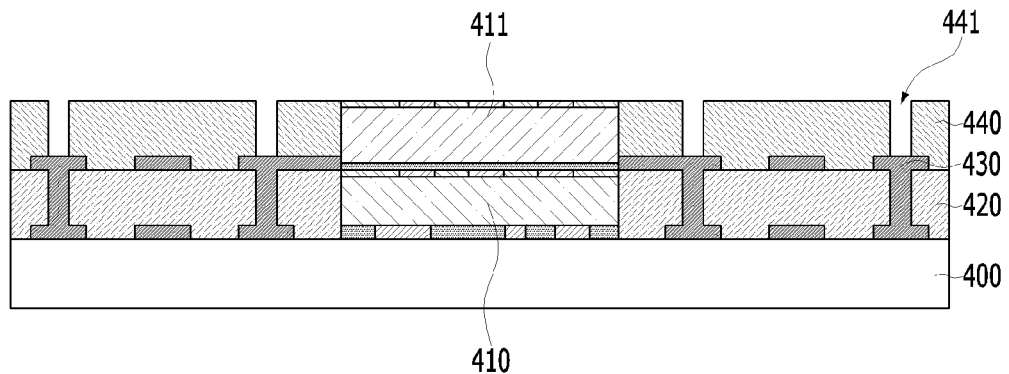
Figure 4D:
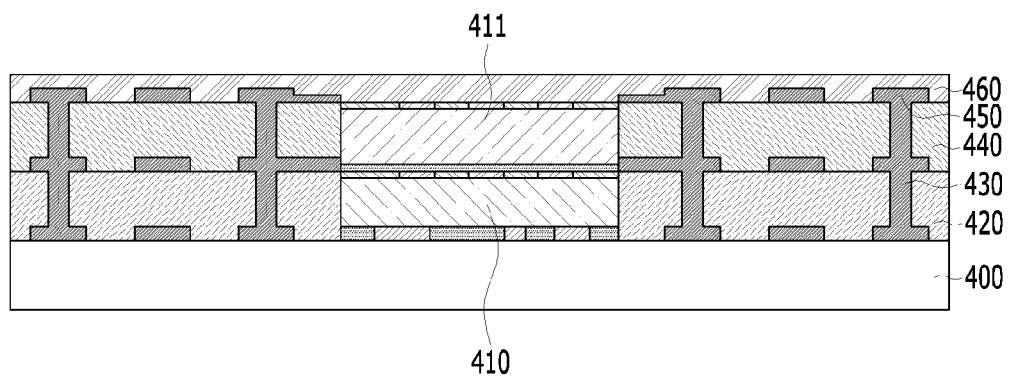

Next, as shown in FIGS. 4C and 4D, a second RDL 450 which is electrically conducted with the first RDL 430 and the second semiconductor chip 411 is formed in partial areas of a top surface of the second passivation layer 440.

For such a second RDL 450, grooves 441 for the second RDL 450 may be formed to correspond to the grooves for the first RDL 430 by using a photolithographic process using a photomask in the same manner as that in the first RDL 430.

Referring to FIG. 4D, when the grooves 441 for the second RDL 450 is formed, the grooves 441 formed so as to be conducted with the second semiconductor chip 411 and the first RDL 430 may be plated with a metallic material for RDL. In this instance, the metallic material for RDL may be formed so as to correspond to a portion in which external connection terminals 470 are to be formed through an etching process.

When the metallic material for RDL is formed, a third passivation layer 460 is formed on the top surface of the second passivation layer 440 and a surface of the second RDL 450. In this instance, the third passivation layer 460 may be made of the same material as those of the first and second passivation layers 420 and 440.

Figure 4E:
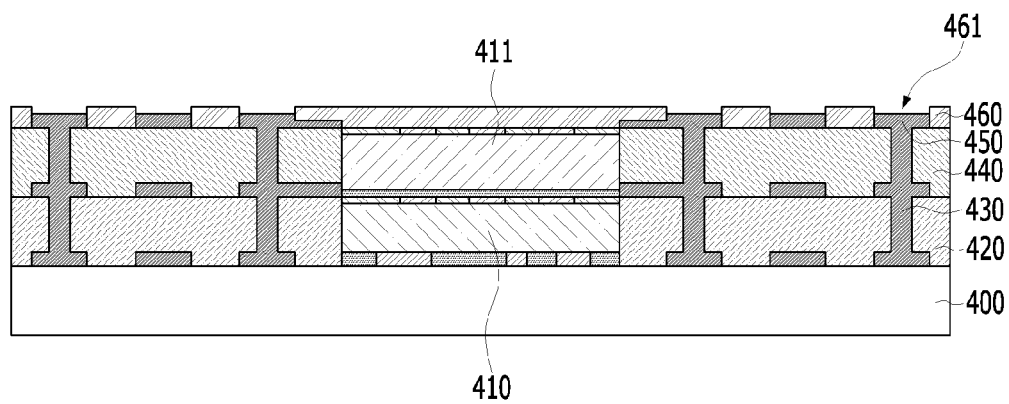

Next, as shown in FIG. 4E, opening portions 461 which are patterned to expose parts of the second RDL 450 are formed in the third passivation layer 460. The opening portions 461 of the third passivation layer 460 may be formed using a general photolithographic process.

Next, a UBM seed layer is formed between the patterns of the third passivation layer 460. The UBM seed layer covers the opening portions 461 of the third passivation layer 460. Next, UBM is formed by filling metal between the patterns of the third passivation layer 460 in which the UBM seed layer is formed. The UBM is formed above the UBM seed layer, and electrically connected to the UBM seed layer.

Figure 4F:
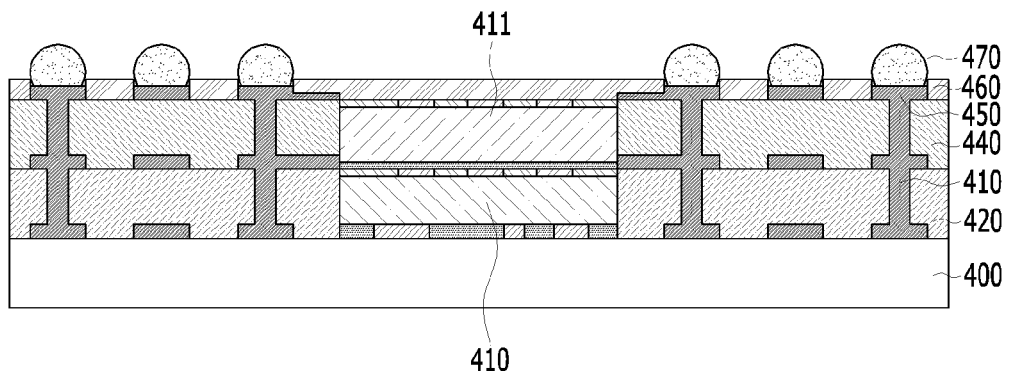

Meanwhile, a laminated fan-out package which is manufactured by a method for manufacturing a wafer level fan-out package according to the second embodiment of the present invention may be carried out in the form in which an external connection terminal is not formed. Unlike this, as shown in FIG. 4F, the external connection terminals 470 may be formed in the opening portions 461 which are partial areas of the second RDL 450 in which the third passivation layer 460 is not formed.

Figure 5:
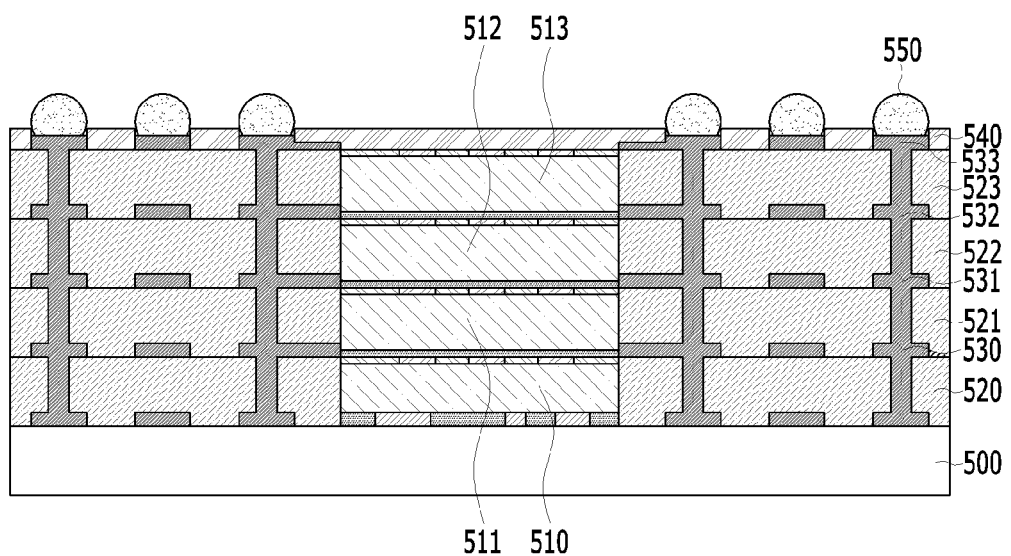
FIG. 5 is a view showing an example in which the wafer level fan-out package formed according to the second embodiment of the present invention is applied.

FIG. 5 is a view showing an example in which the wafer level fan-out package formed according to the second embodiment of the present invention is applied.

The wafer level fan-out package formed according to the second embodiment of the present invention may be implemented in various lamination forms. FIG. 5 shows an example in which the wafer level fan-out package is implemented in a four-lamination form.

Referring to FIG. 5, according to the second embodiment of the present invention, first to fourth semiconductor chips 510, 511, 512, and 513 may be attached on a wafer 500 on which an IO pattern is formed. In this instance, first to fourth passivation layers 520, 521, 522, and 523 may be formed in the same layers as those of the first to fourth semiconductor chips 510, 511, 512, and 513, respectively.

First to fourth RDLs 530, 531, 532, and 533 may be respectively formed in the first to fourth passivation layers 520, 521, 522, and 523, and the first to fourth RDLs 530, 531, 532, and 533 may be formed so as to be electrically conducted with the first to fourth semiconductor chips 510, 511, 512, and 513, respectively.

A fifth passivation layer 540 may be formed on a top surface of the fourth passivation layer 523 and a surface of the fourth RDL 533, and opening portions which expose parts of the fourth RDL 533 may be formed in the fifth passivation layer 540. External connection terminals 550 may be formed in the opening portions which are partial areas of the fourth RDL 533 in which the fifth passivation layer 540 is not formed.

Meanwhile, the four-lamination form of FIG. 5 is merely an embodiment of the present invention, and the wafer level fan-out package may be in various lamination forms according to the purpose desired to be implemented.

Next, a process for manufacturing a wafer level fan-out package according to a third embodiment of the present invention will be described with reference to FIGS. 6A to 6F.

Figure 6A:
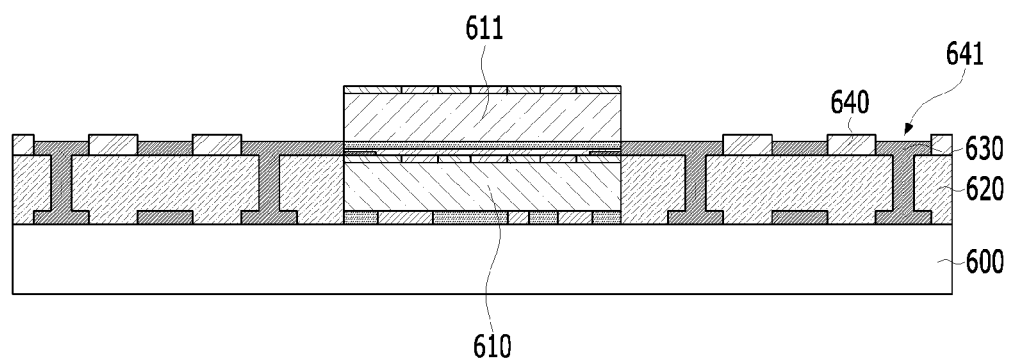
FIGS. 6A to 6F are views showing a process for manufacturing a wafer level fan-out package according to a third embodiment of the present invention.

As to the wafer level fan-out package according to the third embodiment of the present invention, in a state in which the wafer level fan-out package is formed as shown in FIG. 2G, a second semiconductor chip 611 is first attached on a top surface of a second passivation layer 640 so as to correspond to a first semiconductor chip 610 as shown in FIG. 6A. In this instance, the second semiconductor chip 611 may be attached through an attachment film such as a double-sided tape or epoxy in the same manner as that in the first semiconductor chip 610.

Figure 6B:
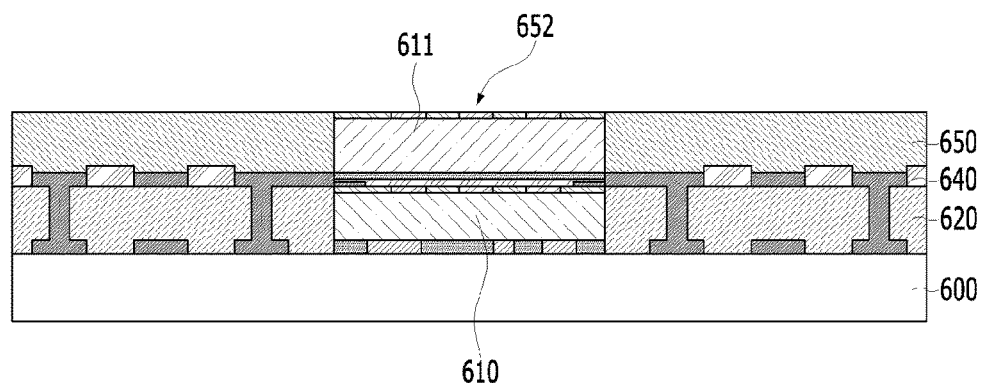

Next, as shown in FIG. 6B, a third passivation layer 650 is formed on top surfaces of the second semiconductor chip 611 and the second passivation layer 640. In this instance, the third passivation layer 650 may be made of the same material as that of the first passivation layer 620.

The third passivation layer 650 may be formed with a certain height so that the top surface of the second semiconductor chip 611 is coated. An opening portion 652 that is patterned and expose the top surface of the second semiconductor chip 611 may be formed in the third passivation layer 650. The opening portion 652 may be formed using a general photolithographic process.

Figure 6C:
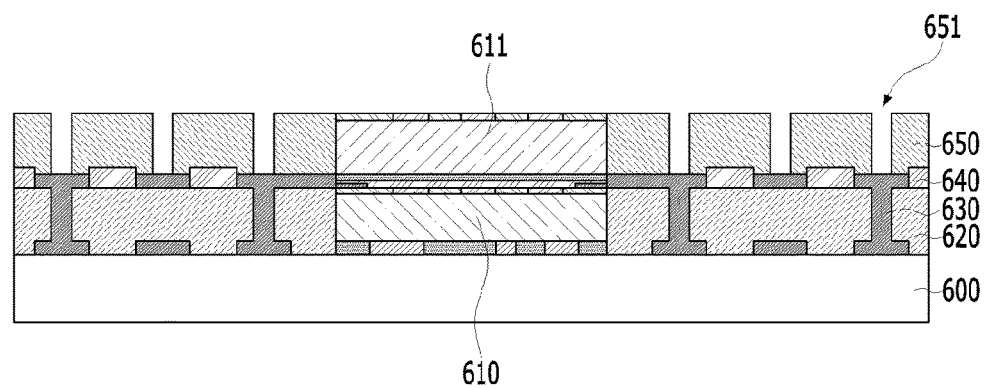
Figure 6D:
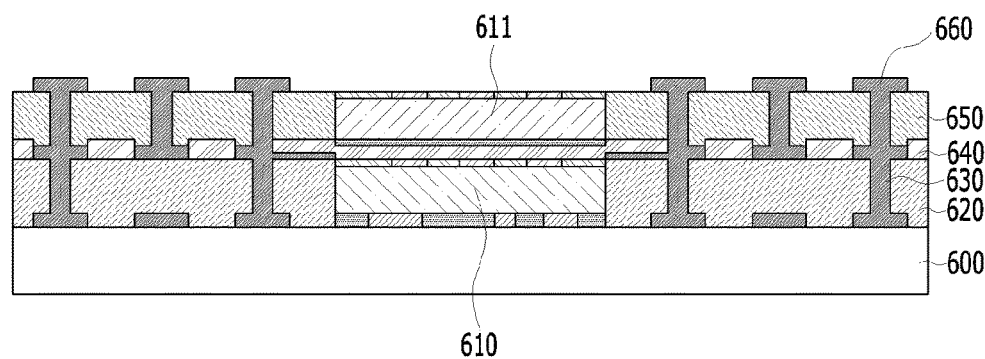

Next, as shown in FIGS. 6C and 6D, a second RDL 660 which is electrically conducted with a first RDL 630 and the second semiconductor chip 611 are formed in partial areas of a top surface of the third passivation layer 650.

For such a second RDL 660, grooves 651 for the second RDL 660 may be formed to correspond to the grooves for the first RDL 630 by using a photolithographic process using a photomask in the same manner as that in the first RDL 630.

When the grooves 651 for the second RDL 660 are formed, the grooves 651 formed so as to be conducted with the second semiconductor chip 611 and the first RDL 630 may be plated with a metallic material for RDL. In this instance, the metallic material for RDL may be formed so as to correspond to a portion in which external connection terminals 680 are to be formed through an etching process.

Figure 6E:
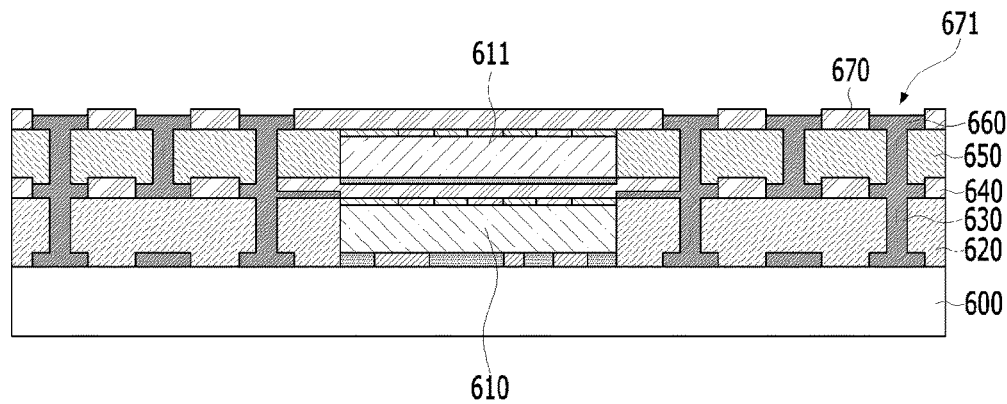

Next, when the metallic material for RDL is formed as shown in FIG. 6E, a fourth passivation layer 670 is formed on the top surface of the third passivation layer 650 and a surface of the second RDL 660. In this instance, the fourth passivation layer 670 may be made of the same material as those of the first to third passivation layers 620, 640, and 650. Next, opening portions 671 which are patterned to expose parts of the second RDL 660 are formed in the fourth passivation layer 670. The opening portions 671 of the fourth passivation layer 670 may be formed using a general photolithographic process.

Next, a UBM seed layer is formed between the patterns of the fourth passivation layer 670. The UBM seed layer covers the opening portions 671 of the fourth passivation layer 670. Next, UBM is formed by filling metal between the patterns of the fourth passivation layer 670 in which the UBM seed layer is formed. The UBM is formed above the UBM seed layer, and electrically connected to the UBM seed layer.

Figure 6F:
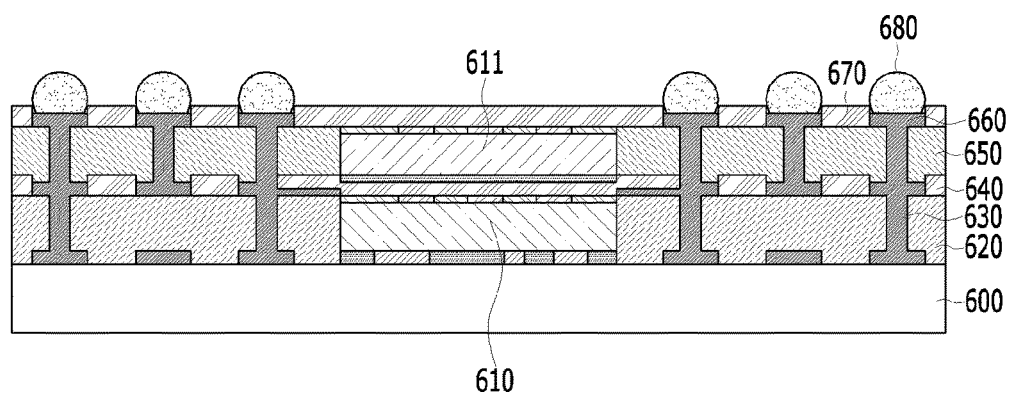

Meanwhile, the fan-out package which is manufactured by the method for manufacturing the wafer level fan-out package according to the third embodiment of the present invention may be carried out in the form in which the external connection terminals 680 are not formed. Unlike this, as shown in FIG. 6F, the external connection terminals 680 may be formed in the opening portions 671 which are partial areas of the second RDL 660 in which the fourth passivation layer 670 is not formed.

Hereinafter, an example in which the wafer level fan-out package formed according to the third embodiment of the present invention is applied will be described with reference to FIGS. 7 and 8.

Figure 7:
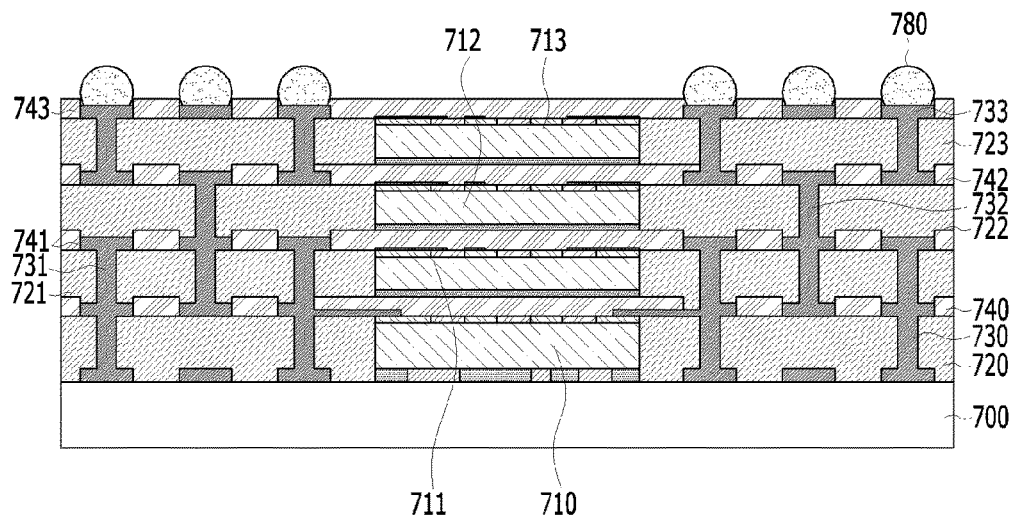
FIGS. 7 and 8 are views showing an example in which the wafer level fan-out package formed according to the third embodiment of the present invention is applied.
Figure 8:
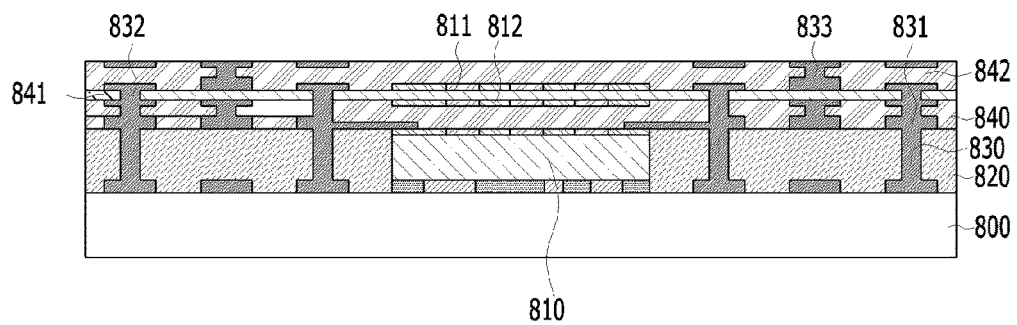

FIGS. 7 and 8 are views showing an example in which the wafer level fan-out package formed according to the third embodiment of the present invention is applied.

The wafer level fan-out package formed according to the third embodiment of the present invention may be implemented in various lamination forms. FIG. 7 shows an example in which the wafer level fan-out package is implemented in a four-lamination form.

Referring to FIG. 7, as to the wafer level fan-out package according to the third embodiment of the present invention, first to fourth semiconductor chips 710, 711, 712, and 713 may be attached on a wafer 700 on which an IO pattern is formed. In this instance, first to eighth passivation layers 720, 721, 722, 723, 740, 741, 742, and 743 may be formed in the same layers as those of the first to fourth semiconductor chips 710, 711, 712, and 713 and in the layers formed above the first to fourth semiconductor chips 710, 711, 712, and 713, respectively.

First to fourth RDLs 730, 731, 732, and 733 may be respectively formed in the first to eighth passivation layers 720, 721, 722, 723, 740, 741, 742, and 743, and the first to fourth RDLs 730, 731, 732, and 733 may be formed so as to be electrically conducted with the first to fourth semiconductor chips 710, 711, 712, and 713, respectively.

In the eighth passivation layer 743 formed on a top surface of the seventh passivation layer 723 and a surface of the fourth RDL 733, opening portions which expose parts of the fourth RDL 733 are formed. External connection terminals 780 may be formed in the opening portions which are partial areas of the fourth RDL 733 in which the eighth passivation layer 743 is not formed.

Meanwhile, as shown in FIG. 8, according to the third embodiment of the present invention, a patterning may be immediately laminated on the passivation layer without additionally laminating the semiconductor chip.

That is, a semiconductor chip 810 may be attached on a wafer 800 on which the IO pattern is formed, and a first passivation layer 820 may be formed in the same layer as that of the semiconductor chip 810.

Next, second to fourth passivation layers 840, 841, and 842 and first to fourth RDLs 830, 831, 832, and 833 may be formed above the first passivation layer 820, respectively. Next, patternings 811 and 812 which are electrically conducted with the semiconductor chip 810 and the first to fourth RDLs 830, 831, 832, and 833 may be formed between the second to fourth passivation layers 840, 841, and 842 without the lamination of the semiconductor chip.

The wafer level fan-out package which has been described in FIGS. 7 and 8 is merely an embodiment of the present invention, and may be in various lamination forms according to the purpose desired to be implemented.

Hereinafter, a method for manufacturing a wafer level fan-out package according to a fourth embodiment of the present invention will be described with reference to FIGS. 9A to 9F and FIG. 10.

FIGS. 9A to 9F are cross-sectional views showing a process for manufacturing a wafer level fan-out package according to a fourth embodiment of the present invention.

Figure 9A:
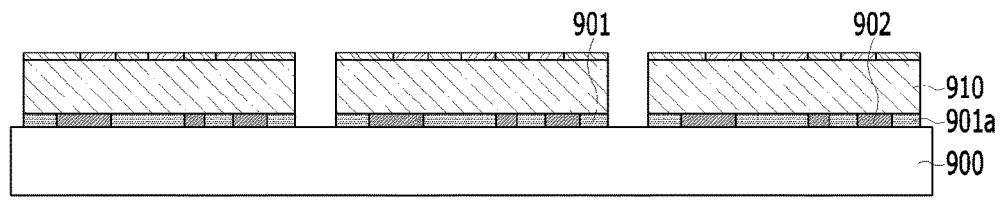
FIGS. 9A to 9F are cross-sectional views showing a process for manufacturing a wafer level fan-out package according to a fourth embodiment of the present invention.

First, as shown in FIG. 9A, a semiconductor chip 910 is attached on a partial area 901a of an IO pattern 901 which is formed on one surface of a wafer 900. In order to secure such a semiconductor chip 910, a double-sided tape 902 referred to as a DAF or epoxy 902 may be used.

Figure 9B:
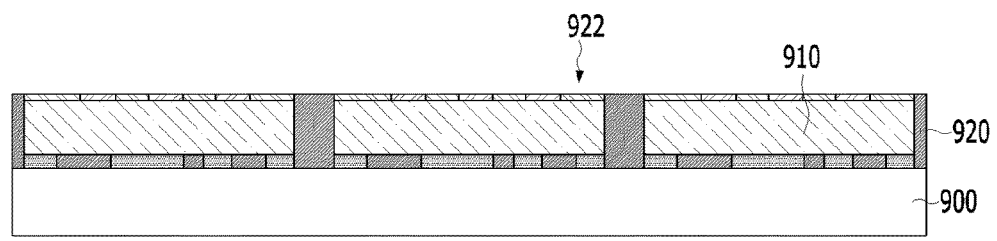

Next, as shown in FIG. 9B, a first passivation layer 920 is formed on the surfaces of the semiconductor chip 910 and the wafer 900. As the material of the first passivation layer 920, any one material selected from PI (polyimide), BCB (benzocyclobutene), PBO (polybenzoxazole), BT (bismaleimide triazine), a phenolic resin, epoxy, silicone, a silicon dioxide ($SiO_2$) film, a silicon nitride ($Si_3N_4$) film, and their equivalents may be used, and these materials may be used alone or in combination.

The first passivation layer 920 may be formed with a certain height so that a top surface of the semiconductor chip 910 is coated. An opening portion 922 that is patterned to expose the top surface of the semiconductor chip 910 may be formed in the first passivation layer 920. The opening portion 922 of the first passivation layer 920 may be formed using a general photolithographic process.

Figure 9C:
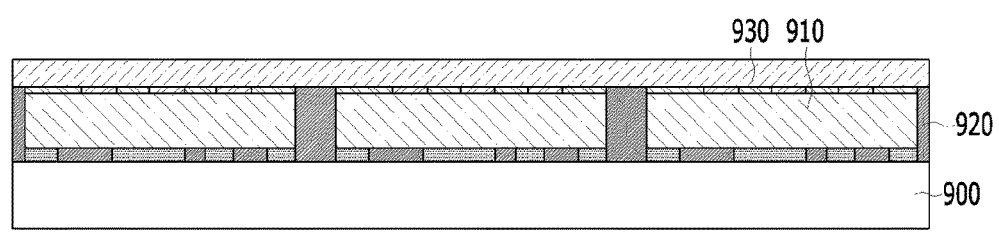

Next, as shown in FIG. 9C, a thermal paste 930 is formed on the top surfaces of the semiconductor chip 910 and the first passivation layer 920. The thermal paste 930 may be a metallic adhesive material having relatively excellent thermal conductivity.

As the material of such a thermal paste 930, an adhesive or a solution in a gel state in which an inorganic filler and an additive are mixed in any one or a mixture of two or more of silicone, epoxy, and urethane resin may be used. In this instance, when the inorganic filler has conductivity, it may be any one or a mixture of two or more of Al, Ag, and Cu, or when the inorganic filler has non-conductivity, it may be any one or a mixture of two or more of $Al_2O_3$, BN, AnO, SiC, AlN, and $SiO_2$.

Figure 9D:
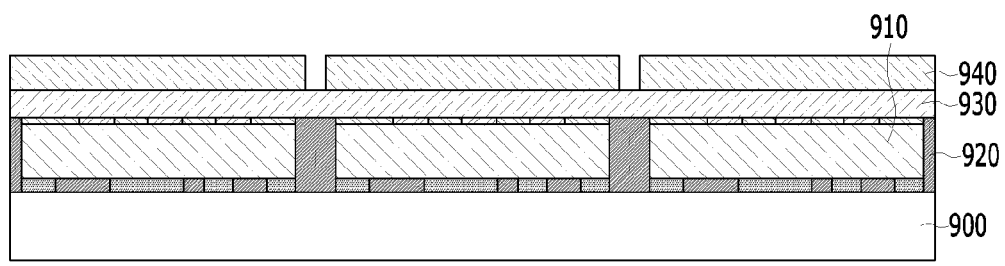

Next, as shown in FIG. 9D, a heat spreader 940 is attached on a surface of the thermal paste 930. In this instance, the heat spreader 940 may be formed so as to correspond to a predetermined interval between the attached semiconductor chips 910.

Figure 9E:
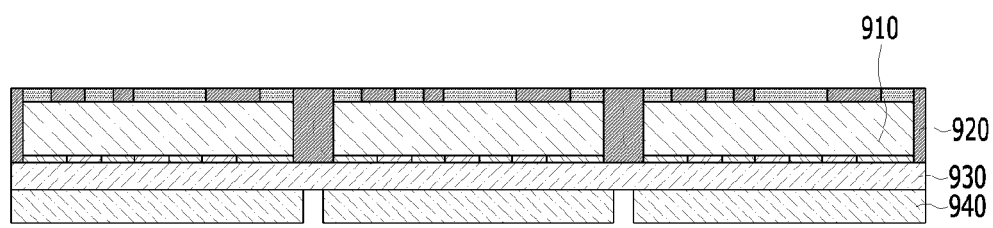
Figure 9F:
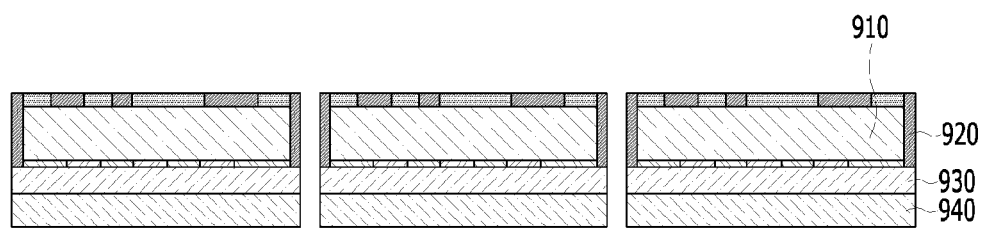

Next, as shown in FIG. 9E, the wafer 900 is removed by polishing the wafer 900 so that a bottom surface of the semiconductor chip 910 is exposed, and as shown in FIG. 9F, sawing is performed along a sawing line of each package.

Meanwhile, as to the wafer level fan-out package according to an embodiment of the present invention, although not shown in detail, one or more RDLs are formed on bottom and/or top surfaces of the wafer level fan-out package, and the second passivation layer may be formed on a surface of the RDL. In this instance, the second passivation layer may be made of the same material as that of the first passivation layer 920.

In addition, an opening portion that is patterned to expose a part of the RDL may be formed in the second passivation layer through a general photolithographic process, and an external connection terminal may be formed in the opening portion.

FIGS. 10A to 10D are views showing an example in which the wafer level fan-out package formed according to the fourth embodiment of the present invention is applied.

Figure 10A:
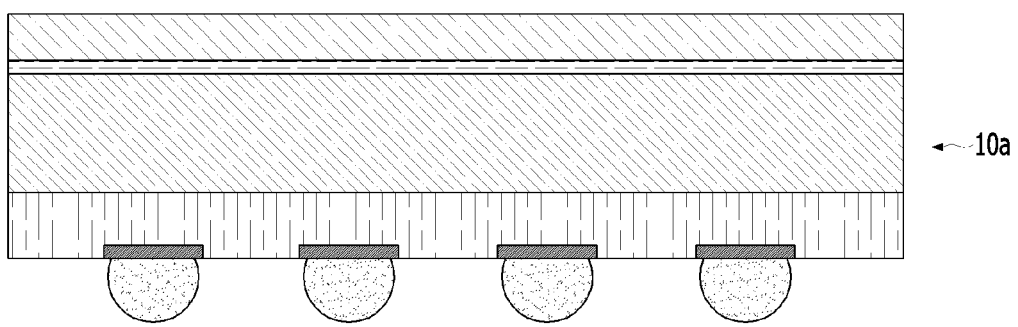
FIGS. 10A to 10D are views showing an example in which the wafer level fan-out package formed according to the fourth embodiment of the present invention is applied.
Figure 10B:
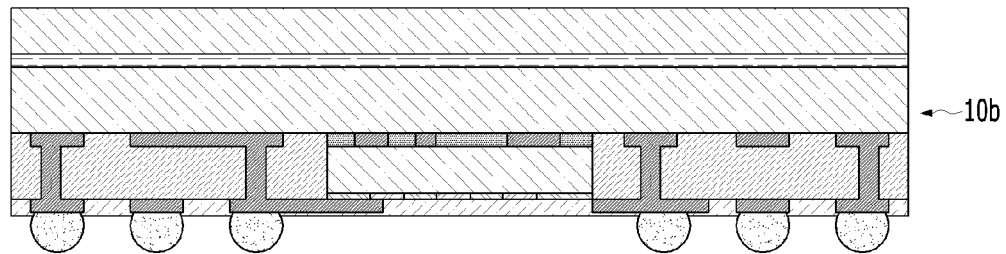
Figure 10C:
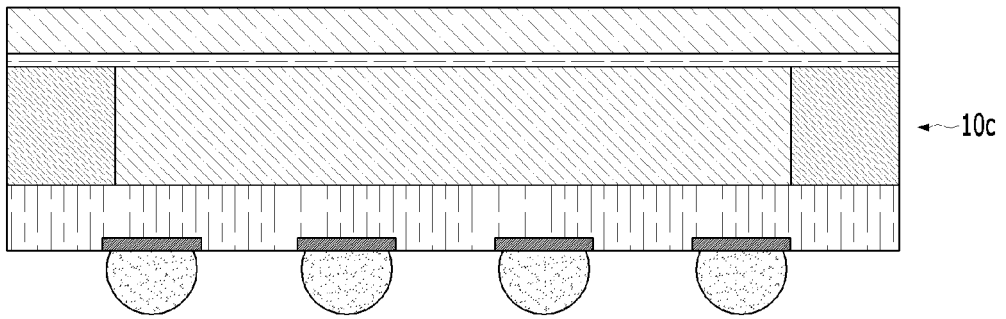
Figure 10D:
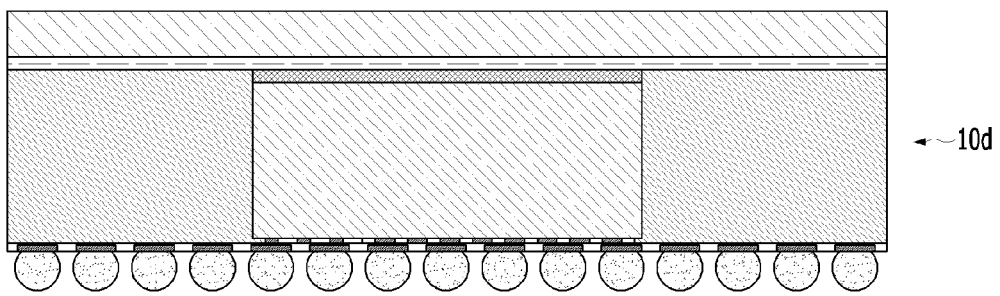

The wafer level fan-out package formed according to the fourth embodiment of the present invention may be applied in various forms such as FO-WLCSP (fan-out-wafer level chip scale package) 10a of FIG. 10A, ECWLFO (embedded chip wafer level fan out) 10b of FIG. 10B, WLFO (wafer level fan out) 10c of FIG. 10C, TEV (through encapsulant via) 10d of FIG. 10D, and the like.

As described above, the wafer level fan-out package according to the embodiments of the present invention has a simple IO structure, and therefore it has the advantage of a wide IO design area.

In addition, it is possible to omit the molding step in the semiconductor package process, and therefore a reduction in the operation time and an increase in the yield may be expected.

In addition, a silicon (Si) or glass wafer having a relatively larger strength than that of the molding compound resin may be used, and therefore it is possible to easily manufacture the fan-out package structure while suppressing the occurrence of cracks and warpage when the bumping step and the lamination step proceed.

In addition, it is possible to improve the reliability of the product quality and the yield.

In addition, the routability may be improved, the wafer level fan-out package according to the present invention may be applied to various package structures and lamination structures, and an increase in the volume of the wafer level fan-out package according to the present invention may be small.

In addition, the heat spreader may be directly attached to the wafer, and therefore it is possible to reduce the process time.

In addition, the wafer level fan-out package according to the present invention may include the thermal paste, and therefore it is possible to expect the rapid heat dissipation effect.

In addition, an increase in the volume of the wafer level fan-out package according to the present invention may be small, and the wafer level fan-out package according to the present invention may be utilized in various application products through the lamination structure capable of implementing various functions.

In addition, crack and warpage phenomena may be suppressed through the lamination structure for the multilayered structure, and the reliability of the product quality and the yield may be improved when the lamination step proceeds.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method for manufacturing a wafer level fan-out package, comprising:
attaching a semiconductor chip on a partial area of an IO pattern formed on one surface of a wafer;
forming a first passivation layer on surfaces of the semiconductor chip and the wafer;

forming a thermal paste on the top surface of the first passivation layer and a top surface of the semiconductor chip;

attaching a heat spreader on a surface of the thermal paste;

after attaching the heat spreader, removing the wafer by polishing the wafer; and performing sawing along each package sawing line.

2. The method for manufacturing a wafer level fan-out package of claim 1, wherein the forming of the first passivation layer includes:

forming the first passivation layer with a certain height so that the top surface of the semiconductor chip is coated; and patterning the first passivation layer to expose the top surface of the semiconductor chip.

3. The method for manufacturing a wafer level fan-out package of claim 1, wherein the heat spreader is formed so as to correspond to a predetermined interval between the attached semiconductor chips.

* * * * *